(12) United States Patent
Ahmad et al.

(10) Patent No.: US 7,277,297 B2
(45) Date of Patent: Oct. 2, 2007

(54) DEVICE, APPARATUS, METHOD AND ASSEMBLY FOR COUPLING AN ELECTRICAL COMPONENT WITH A CIRCUIT BOARD

(75) Inventors: Mudasir Ahmad, Santa Clara, CA (US); Mason Hu, Cupertino, CA (US); Robert Pattison, Mountain View, CA (US); David Anthony Popovich, San Jose, CA (US)

(73) Assignee: Cisco Technology, Inc, San Jose, CA (US)

( * ) Notice: Subject to any disclaimer, the term of this patent is extended or adjusted under 35 U.S.C. 154(b) by 288 days.

(21) Appl. No.: 11/066,877

(22) Filed: Feb. 25, 2005

(65) Prior Publication Data

US 2006/0193118 A1    Aug. 31, 2006

(51) Int. Cl.
*H05K 7/00* (2006.01)

(52) U.S. Cl. .................................................. 361/760

(58) Field of Classification Search ................ 361/760, 361/412, 414, 393, 395, 397; 439/66–67, 439/69, 74; 174/250–251, 260, 262–263
See application file for complete search history.

(56) References Cited

U.S. PATENT DOCUMENTS

| 4,097,101 A | * | 6/1978 | Holt et al. ...................... 439/82 |
| 4,211,603 A | | 7/1980 | Reed |
| 4,526,429 A | * | 7/1985 | Kirkman ....................... 439/82 |
| 5,038,252 A | * | 8/1991 | Johnson ....................... 361/792 |
| 5,425,649 A | * | 6/1995 | Reymond .................... 439/189 |
| 5,645,433 A | * | 7/1997 | Johnson ........................ 439/66 |
| 6,705,006 B2 | | 3/2004 | Baechtle et al. |
| 6,912,780 B2 | * | 7/2005 | Chamberlin et al. .......... 29/853 |

OTHER PUBLICATIONS www.deltarf.com, "MMCX Series Coaxial Connectors," 8 pages total, 2003, Delta Electronics Manufacturing Corporation, www.deltarf.com/pdf/deltammcx.pdf.

* cited by examiner

*Primary Examiner*—Jean F. Duverne
(74) *Attorney, Agent, or Firm*—Marger Johnson & McCollom, P.C.

(57) ABSTRACT

A device, apparatus and printed circuit board assembly for removably coupling an electrical component with a PCB are described, which provides adequate electromechanical capability, is relatively insensitive to related heating, component removability, replacability and reworkability while minimizing wear and the possibility of resizing and damage. The device includes a sleeve for coupling with a component pin, which encloses the pin and further couples to a conductive barrel interconnecting multiple PCB layers. The sleeve conforms upon insertion within the barrel to its contour. A flange at an end of the sleeve deters over-insertion. The coupling so formed can be gas-tight.

30 Claims, 9 Drawing Sheets

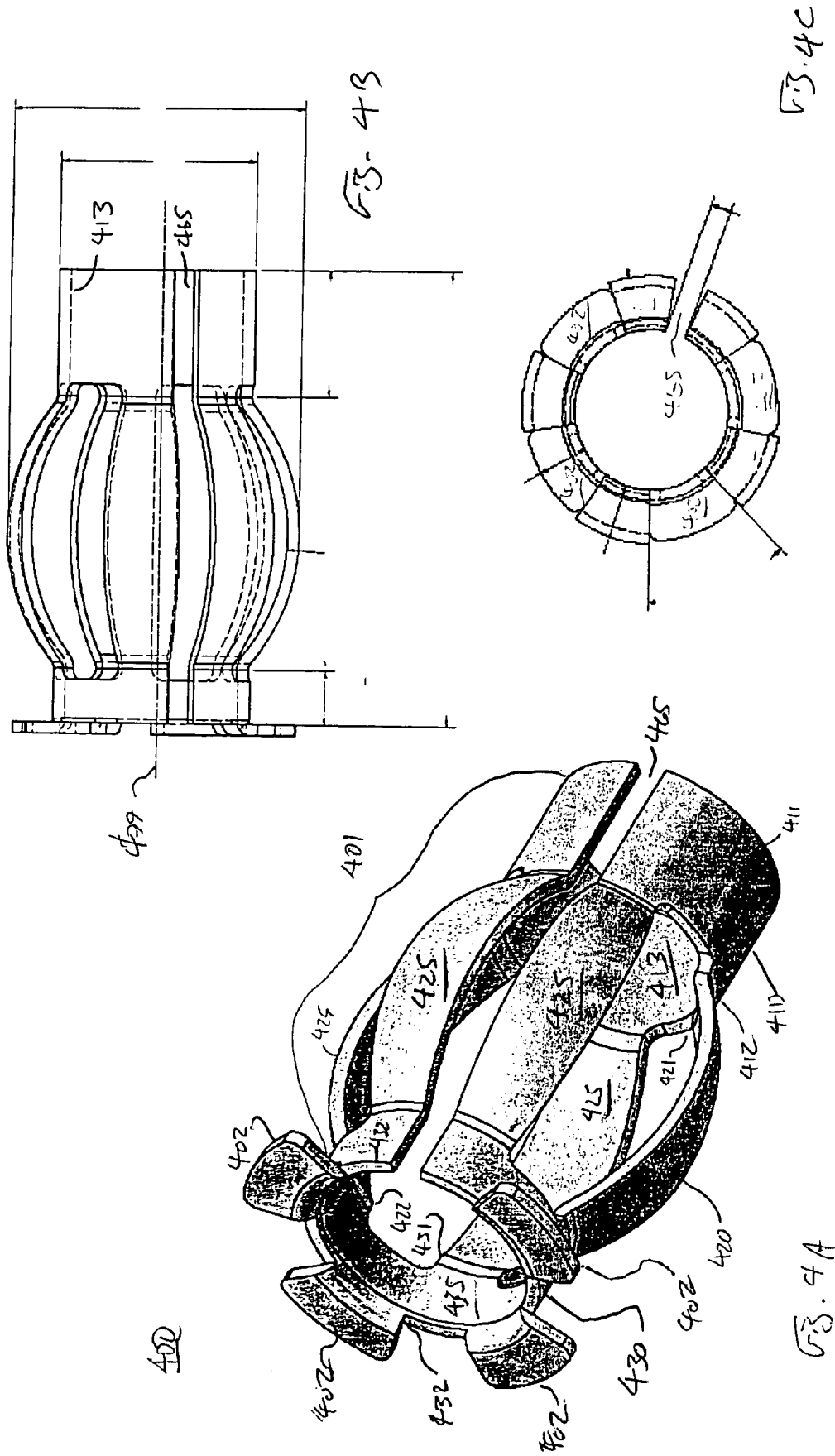

DEVICE, APPARATUS, METHOD AND ASSEMBLY FOR COUPLING AN ELECTRICAL COMPONENT WITH A CIRCUIT BOARD

TECHNICAL FIELD

The present invention relates generally to the field of electrical connections. More specifically, embodiments of the present invention relate to devices, apparatus, assemblies and methods for coupling an electrical component with a printed circuit board.

BACKGROUND

The printed circuit board (PCB) is a common component in modern electronic devices. PCBs hold (e.g., deploy, mount, support, etc.) integrated circuits (ICs) and other electronic devices, components, etc. PCBs comprise substantially planar, typically multi-layered boards that electrically interconnect the ICs, devices and components with conductive pathways (e.g., conductors, traces, etc.). Individual layers are bonded together to form a multi-layer PCB.

Their topologies and other attributes allow such PCBs to have conductive pathways on each of its several layers. Such multiplication of available conductive pathways promotes the ability of the PCBs to interconnect large numbers of such ICs and other devices, etc. and to support complex components (e.g., each having large numbers of integrated elementary components, etc.). This has benefits related to technical, economic, and/or other considerations.

Each PCB layer has a substantially planar base of an electrically insulating material, such as plastic, fiberglass, etc. The layer's conductive pathways are typically etched into a conductive material disposed upon a surface of that insulating base. Conductive pathways of each layer are insulated from those of adjacent layers with insulating bases. Conductive pathways of each layer are connectable with those of other layers with interlayer connections.

ICs and other devices are typically mounted on the surface of the PCB's outer layer by soldering their leads, traces, etc. into holes within the PCB. To use conductive pathways on other than the surface layer, the devices are electrically connected through these holes. Conventionally, such through-hole mounted devices, which they are sometimes called, are affixed and electrically connected using wave soldering and/or other soldering techniques.

Some through-hole mounted devices have significant size and weight. For instance, processors, and other devices may dissipate significant amounts of heat during their operation and may thus be mounted on the PCB with a heat sink of substantial relative weight. Power bricks and other devices can have substantial weight of their own, and may also be mounted on the PCB with a heavy heat sink, as well.

The weight of these devices and related inertial effects (e.g., in PCBs used in non-static installations) can stress the through-hole mounting. Heat they produce while operating can exacerbate negative effects related to this stress. Further, during operation, such devices may draw significant amounts of current, with related heat generating effects. Such currents determine the current carrying capacity characteristics, e.g., the ampacity, required for through-hole connections.

Such stresses and heating can adversely affect electrical characteristics including ampacity, and mechanical characteristics such as strength and brittleness of electromechanical connections. Such adverse effects can have unbeneficial consequences relating to capability, reliability, quality, etc. Conventional wave soldered through hole mounts can be subject to such adverse effects.

Further, challenges can be encountered in wave soldering large PCBs of several layers. For instance, for wave soldering (and other soldering techniques) to be effective for through hole mounting, the hole should be adequately and thoroughly heated, to allow molten solder to "wick" up into the hole to make a sound connection to a device lead therein. With differing thermal conductivities, localized heating, and other heating characteristics associated with various parts (e.g., depths within, etc.) of the hole however, this can be difficult to achieve. Conventional solutions such as thermal relief spokes are sometimes used. Notwithstanding however, thorough adequate heating of the hole can remain difficult to achieve and a complete solder fill may not be possible in some holes.

Conventionally, the problem of localized heating is sometimes addressed by removal of heat conducting components associated with a device to be mounted. For instance, relatively weighty devices such as power bricks and sizable heat sinks may be held in place on a PCB with mounting screws. The mounting screws however can effectively act as heat sinks during wave soldering, which can deter thorough adequate heating of the hole. To deter such localized heating during the wave soldering process, the mounting screws are sometimes removed, with some success.

This solution however poses other difficulties. For instance, after wave soldering the screw-mounted device with its mounting screws removed, the screws can not readily be replaced, because torquing the screws can mechanically stress the through-hole solder joint, possibly damaging or breaking it. Thus, the sole remaining mechanical support for the device after wave soldering is the through-hole solder joint just formed, which may only be partially filled. Stress from the device's weight and related inertial effects can adversely affect the mechanical strength, electrical integrity, and reliability of the solder joint, which may already be impacted by a less than thorough solder fill.

Further, wave-soldered through-hole mounts can be difficult or impossible to rework without damaging a PCB. Attempts to remove a device wave soldered to a PCB, e.g., for replacement, include de-soldering and a removing force, e.g., followed by re-soldering and an applying force. De-soldering and re-soldering heats the joint, e.g., to re-melt solder or allow molten solder to flow though the hole. Heat so added can be conducted to the device, to other devices, and into the insulating component of one or more layers and can cause damage. Mechanical stresses and strains associated with removing and installing the device can also cause damage.

Further, heating during wave soldering may not be uniform throughout the hole, which may thus be spanned by a significant temperature gradient. Such a significant temperature gradient can cause unequal cooling during solidification and crystallization of the solder. This can result in cracks and other deformities forming within the solder mass. Such defects can be especially troubling where the hole does not completely or adequately fill with solder. These defects can also adversely affect the electrical integrity of the solder joint. Thus reliability and quality can be impacted. Electrical and mechanical failures of solder joints have occurred, with resultant impact on the performance of the PCB.

Conventional approaches to the issues confronting wave soldering of large multi-layered (e.g., thick) PCBs include the Thermal Relief and Ampacity (THRAA) hole design. The THRAA hole design can achieve decent solder fill in holes of high layer count PCBs. However, the THRAA approach typically uses a manual process wherein each board is redesigned for incorporation. Numerous peripheral vias are typically needed, depending on the function of the PCB. It has been difficult to ascertain, prior to physical implementation, how many such vias are optimal for each hole. Further, reworking remains problematic even with the THRAA approach, because heating and mechanical stresses associated therewith still make damaging a PCB likely in rework.

One conventional approach to making connections on multi-layered PCBs uses a press-fit pin approach, e.g., to reduce dependency on solder as an electrical connection medium. Press-fit approaches apply a significant force to insert connection pins, and to extract them, e.g., in reworking the PCB. The forces used for insertion and extraction of the pins can be substantial. While the conventional press-fit pin approach can reduce dependency on solder, the substantial forces used therewith can damage conductive and insulating portions of various PCB layers and devices such as power bricks and neighboring devices and components and thus also render rework problematic. The potential for damage associated with this approach is too great for certain applications. Some other conventional approaches, such as the mill-max pin-in-socket design wherein a conductive socket is soldered into the PCB, prior to attachment of the pin, do not directly address the challenges posed by wave soldering.

Thus, conventional approaches to coupling electrical components can provide issues related to current carrying capability and concomitant heating effects, solderability, component removability, replacability and reworkability and/or mechanical supportability. Moreover, some techniques developed in response to these issues can provide issues of their own, some of which relate to the potential of such techniques causing resizing (e.g., of holes and proximate PCB material), wear and/or damage of the PCBs and/or the electrical components.

BRIEF DESCRIPTION OF THE DRAWINGS

FIG. 4A depicts an exemplary device for removably coupling an electrical component with a circuit, according to an embodiment of the present invention.

FIG. 4B depicts the exemplary device for removably coupling an electrical component with a circuit from a side perspective, according to an embodiment of the present invention.

FIG. 4C depicts the exemplary device for removably coupling an electrical component with a circuit from a top perspective, according to an embodiment of the present invention.

DETAILED DESCRIPTION

Figure 1A:
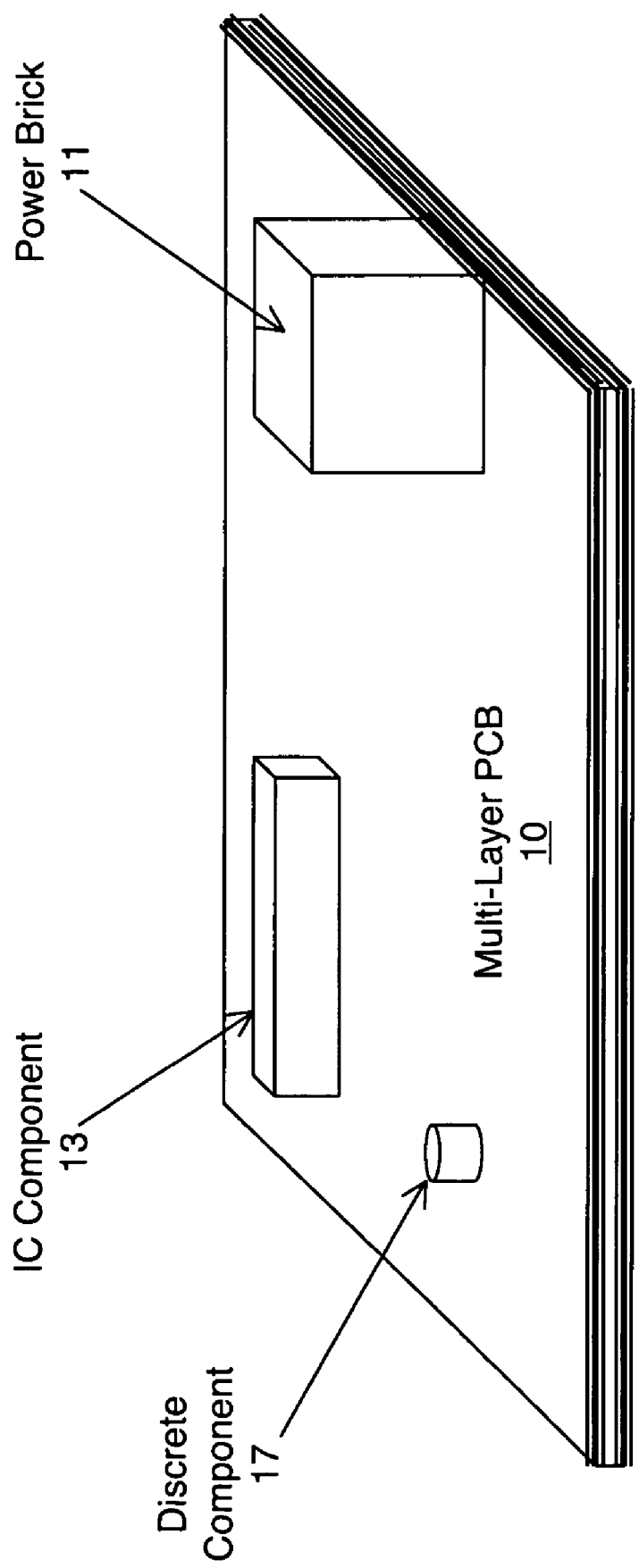
FIG. 1A depicts an exemplary circuit board assembly, upon which an embodiment of the present invention may be practiced.

Exemplary embodiments of the present invention are described below and relate to a device, apparatus and printed circuit board assembly for removably coupling an electrical component with a printed circuit board. Reference is now made in detail to several embodiments of the invention, examples of which are illustrated in the accompanying drawing figures. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of exemplary embodiments of the present invention, numerous specific details are set forth in order to provide a thorough understanding of the present invention. However, one of ordinary skill in the art will realize that embodiments of the present invention may be practiced without these specific details. In other instances, well-known devices, apparatus, methods, systems, processes, procedures, components and circuits have not been described in detail so as not to unnecessarily obscure aspects of the present invention.

Portions of the detailed description that follows are presented and discussed in terms of processes. Although steps and sequencing thereof are disclosed in figures herein (e.g., FIGS. 5-6) describing the operations of these processes (e.g., processes 50-60, respectively), such steps and sequencing are exemplary. Embodiments of the present invention are well suited to performing various other steps or variations of the steps recited in the flowcharts of the figures herein, and in a sequence other than that depicted and described herein.

Embodiments of the present invention provide a device, apparatus and printed circuit board assembly for removably coupling an electrical component with a printed circuit board (PCB), which provide adequate electrical and mechanical (e.g., electromechanical) capability, is relatively insensitive to related heating, component removability, replacability and reworkability while minimizing wear and the possibility of resizing and damage. The device includes a sleeve for coupling with a component pin, which encloses the pin and further couples to a conductive barrel interconnecting multiple PCB layers. The sleeve conforms upon insertion within the barrel to its contour. A flange at an end of the sleeve deters over-insertion. In one embodiment, the coupling so formed is gas-tight.

Therefore, embodiments of the present invention achieve coupling of electrical devices and PCBs while minimizing issues related to current carrying capability and concomitant heating effects, solderability, component removability, replacability and reworkability and mechanical supportability, which can characterize conventional approaches. Further, embodiments of the present invention achieve such coupling of electrical devices and PCBs while minimizing the possibility of resizing and damage to the PCB and to the electrical component.

Exemplary Multilayer Circuit Board Assembly

FIG. 1A depicts an exemplary circuit board assembly 100, upon which an embodiment of the present invention may be practiced. Circuit board assembly 100 has a multilayer circuit board 10, which comprises a number of separate, substantially co-planar and substantially insulating layers, each bonded one to another. Circuit board 10 has mounted on its surface a number of exemplary electronic components, including an integrated circuit (IC) component 13 and a discrete component 17 such as a transistor, a capacitor, etc. It is appreciated that various numbers and types of such components can be mounted on circuit board 10.

The exemplary components of circuit board 10 also include a power brick component 11, which provides power to other components. More than one of the layers comprising circuit board 10 have printed or otherwise disposed thereon (e.g., therein, etc.) a conductive element (such as a pathway, conductive trace, conductor, etc.), which can electrically connect (e.g., interconnect, etc.) exemplary components 11, 13 and 17, etc.

Figure 1B:
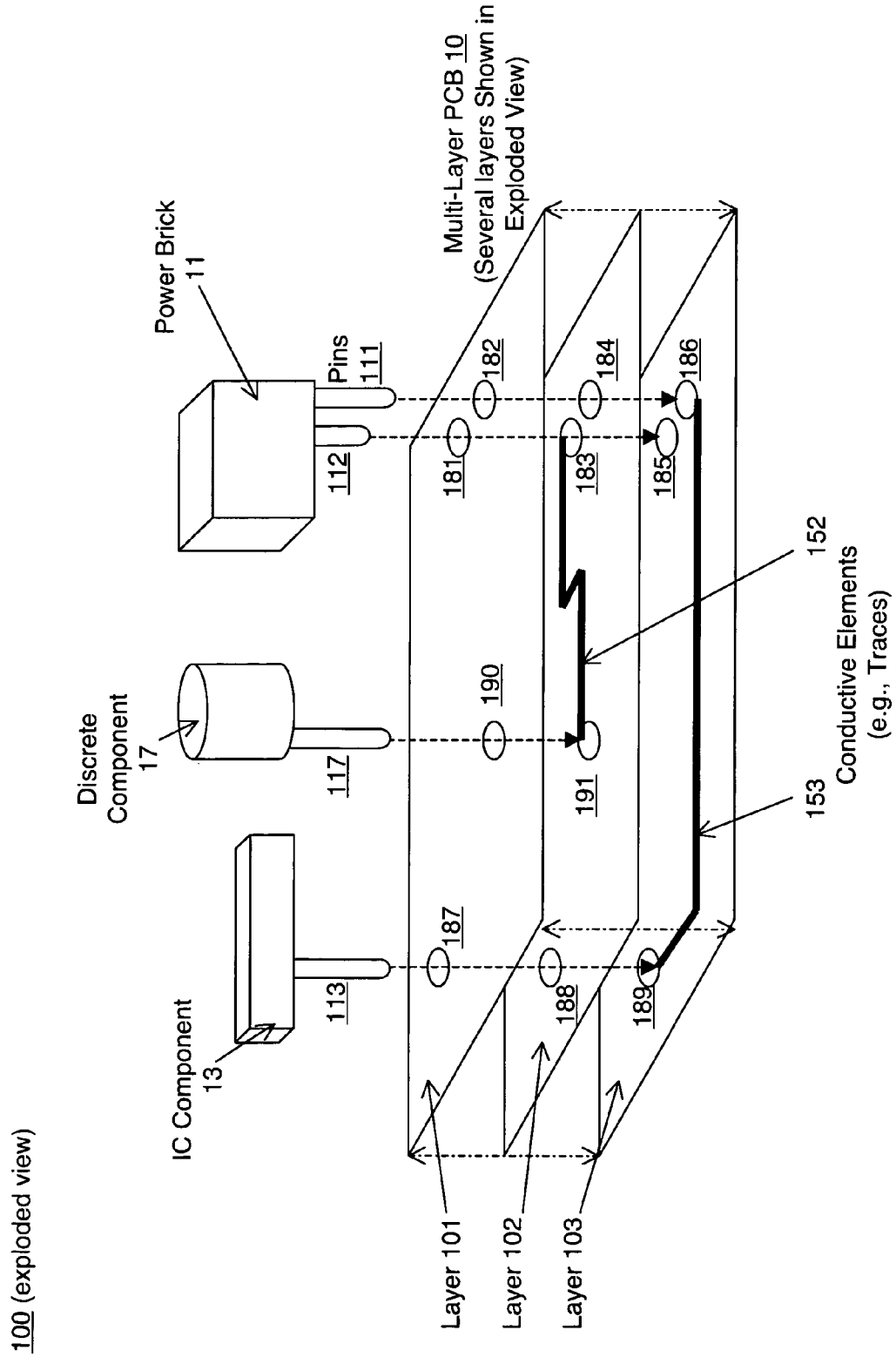
FIG. 1B depicts an exploded view of the exemplary circuit board assembly, upon which an embodiment of the present invention may be practiced.

FIG. 1B depicts an exploded view of the exemplary circuit board assembly 100, upon which an embodiment of the present invention may be practiced. Multilayer printed circuit board (PCB) 10 includes three exemplary layers 101, 102, and 103. It is understood that other layers may also comprise the PCB. Layer 101 is bonded to layer 102, which is bonded to layer 103.

The exemplary components 11, 13 and 17 include conductive pins for mounting (e.g., mechanically connecting) their components to PCB 10 and for electrically connecting the component, such as to conductive elements (e.g., printed traces, etc.) 152 and 153. Power brick component 11 has two pins 111 and 112, which mount power brick 11 into holes which penetrate layers of PCB 10. Pin 111 is inserted into holes 182, 184 and 186, which respectively penetrate layers 101, 102 and 103. Pin 112 is inserted into holes 181, 183 and 185, which also respectively penetrate layers 101, 102 and 103.

IC component 13 and discrete component 17 respectively have pins 113 and 117, which mount their components into holes which penetrate layers of PCB 10. It is appreciated that these components may comprise other pins as well. Pin 113 is inserted into holes 187, 188 and 189, which respectively penetrate layers 101, 102 and 103. Pin 117 is inserted into holes 190 and 191, which respectively penetrate layers 101 and 102.

Conductive elements 152 and 153 are electrically insulated one from another. Conductive element 152 is disposed upon (e.g., within, etc.) layer 102 and is electrically accessible at an inner surface of holes 183 and 191. Conductive element 153 is disposed upon layer 103 and is electrically accessible at an inner surface of holes 186 and 189. Devices and/or apparatus described herein couple with the pins (e.g., electrically, mechanically) and allow mounting, connection, etc. of the devices such that they are mechanically securely mounted on PCB 10 and electrically coupled with conductive elements 152 and 153, etc.

Thus, conductive element 153 interconnects pin 113 of IC component 13 with pin 111 of power brick 11, such as to supply a voltage from power brick 11 to IC component 13. Similarly, conductive element 152 interconnects pin 117 of discrete component 17 with pin 112 of power brick 11, such as to supply a voltage from, or allow a current return path to (e.g., to a ground reference, etc.), from power brick 11 to discrete component 17.

Figure 2A:
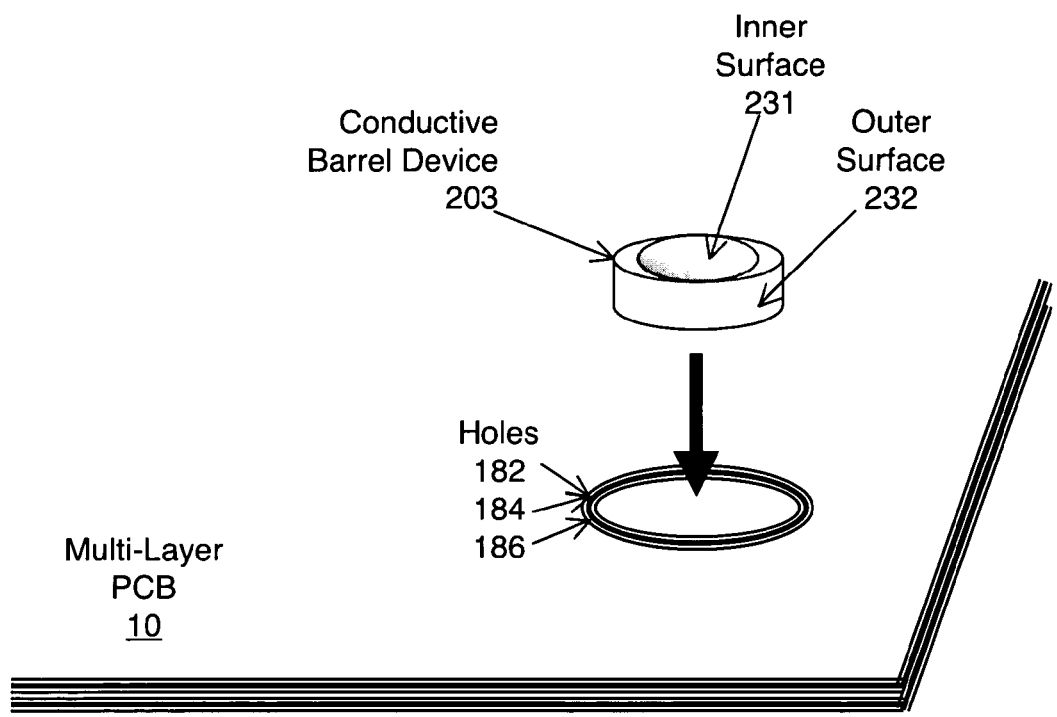
FIG. 2A depicts the exemplary circuit board assembly, according to an embodiment of the present invention.

FIG. 2A depicts the exemplary circuit board assembly 100, according to an embodiment of the present invention. A conductive barrel device 203, in one embodiment having a substantially cylindrical configuration, is disposable within a hole in PCB 100 such as holes 182, 184 and 186. Conductive barrel device 203 has an inner surface 231. In one embodiment, barrel device 203 has an outer surface 232.

Figure 2B:
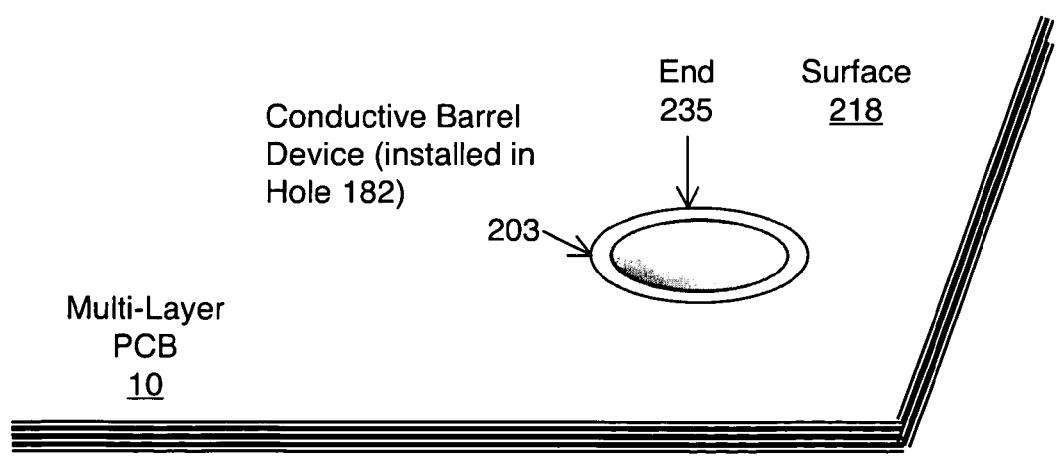
FIG. 2B depicts an exemplary barrel device installed in the circuit board assembly, according to an embodiment of the present invention.

FIG. 2B depicts an exemplary barrel device installed in the circuit board assembly, according to an embodiment of the present invention. In one embodiment, barrel device 203 is inserted within the holes. In another embodiment, barrel device is plated within the holes or similarly deposited so as to substantially line the inner surface of the hole. Installed in the holes 182, 184 and 186 of PCB 10, barrel device 203 forms an effective electrical via therein, which allows contact with a part of conductive elements exposed to the inner surface thereof, such as conductive element 153. An end surface 235 of conductive barrel device 203 is substantially co-planar with a surface 218 of PCB 10.

Exemplary Apparatus

Figure 3A:
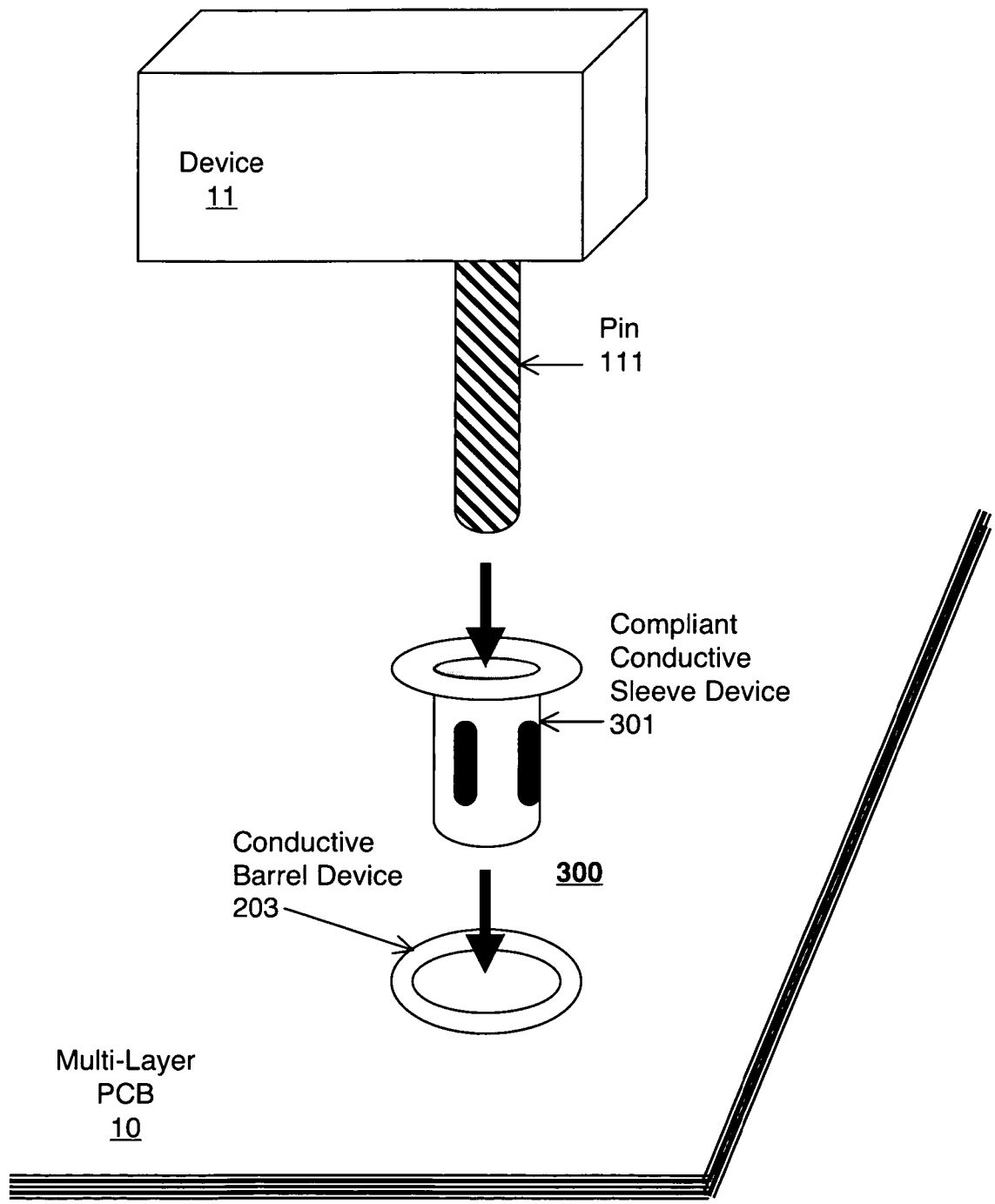
FIG. 3A depicts an exploded view of an exemplary apparatus for removably coupling an electrical component with a circuit board, according to an embodiment of the present invention.

FIG. 3A depicts an exploded view of an exemplary apparatus 300 for removably coupling an electrical component with a circuit board, according to an embodiment of the present invention. Apparatus 300 comprises a compliant conductive sleeve device 301 and conductive barrel device 203 (FIG. 2A). In one embodiment, an inner surface 328 of sleeve device 301 removably couples with the outer surface of component pins such as pin 111 of power brick device 11.

Figure 3B:
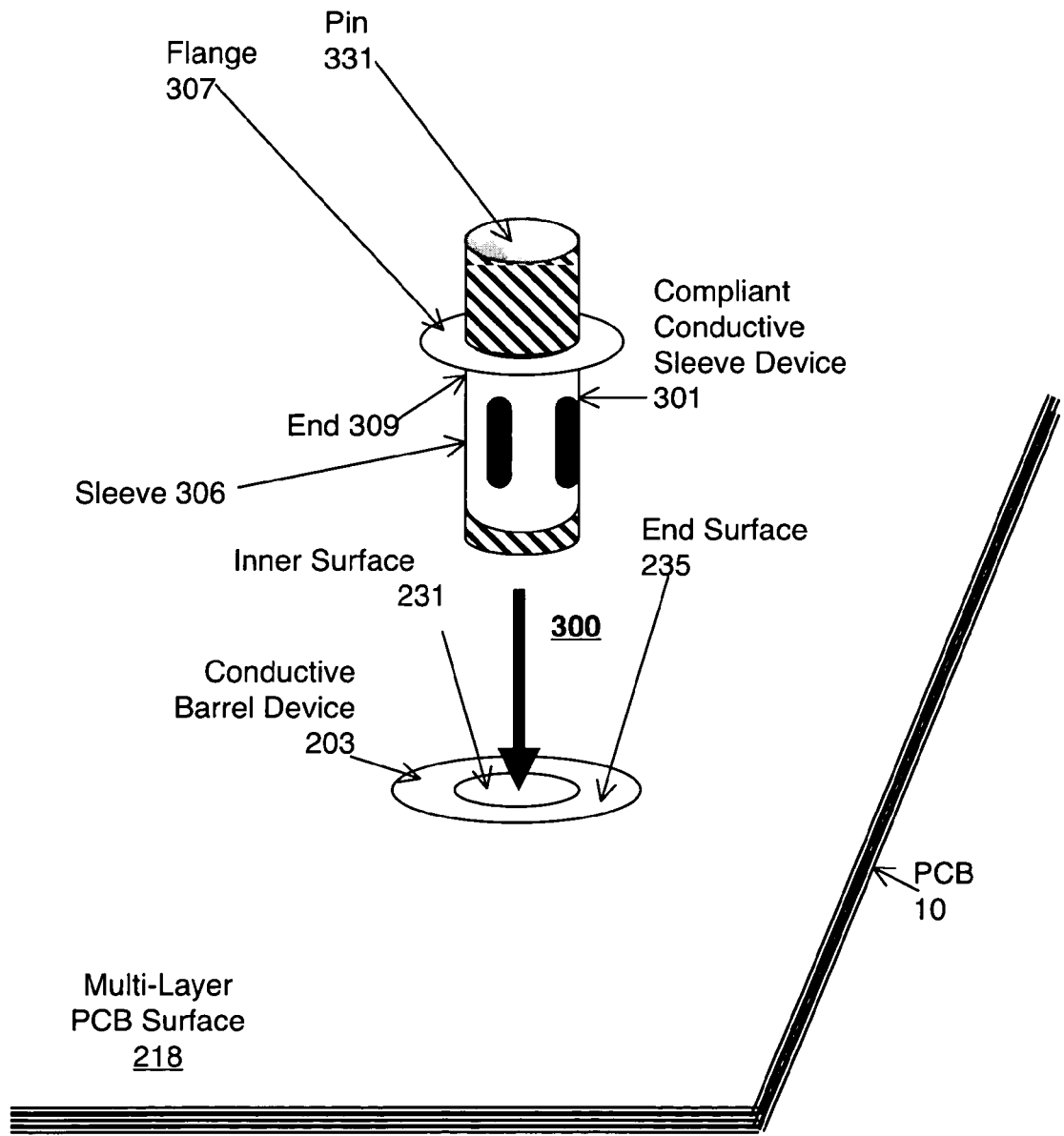
FIG. 3B depicts an exemplary apparatus for removably coupling an electrical component with a circuit board, according to an embodiment of the present invention.

FIG. 3B depicts a partly assembled view of exemplary apparatus 300 for removably coupling an electrical component with a circuit board, according to an embodiment of the present invention. An inner surface 231 (FIG. 3A) of sleeve device 301 compliantly conforms with the outer surface of pin 111 in a substantially annular or cylindrical aspect and effectively couples therewith electrically and mechanically.

In one embodiment, compliant conductive sleeve device 301 comprises a sleeve portion 306 and a flange portion 307 coupled at an end 309 thereof. Upon insertion, flange portion 307 is proximate to end surface 235, in one embodiment abutting it, and effectively prevents excessively deep insertion of conductive sleeve device 301 within conductive barrel device 203.

In one embodiment, an outer surface of sleeve device 301 removably couples with the inner surface 231 of conductive barrel device 203. The outer surface of sleeve device 301 compliantly conforms with the inner surface 231 of barrel device 203, which envelopes (e.g., surrounds, circumscribes, encloses, etc.) the sleeve device in a substantially annular or cylindrical aspect and effectively couples therewith electrically and mechanically. Thus, apparatus 300 effectively electrically and mechanically couples exemplary power brick device with PCB 10, such as to conductive elements therein.

In one embodiment, conductive sleeve device 301 is installed upon (e.g., about, etc.) the outer surface of pin 111, wherein pin 111, with conductive sleeve device 301 installed thereon, is inserted within conductive barrel device 203 to form apparatus 300, which couples the component 11 and the PCB 10. In another implementation, conductive sleeve device is inserted into conductive barrel device 203 to form apparatus 300 with pre-installation of the conductive sleeve device. Pin 11 is then inserted within the pre-installed conductive sleeve device to achieve the electrical and mechanical coupling with the PCB 10.

Exemplary Device

FIG. 4A depicts an exemplary device 400 for removably coupling an electrical component with a circuit, according to an embodiment of the present invention. Coupling device 400 comprises one implementation of a compliant conductive sleeve device, such as sleeve device 301 (FIG. 3A, 3B).

Coupling device 400 for removably coupling an electrical component with a circuit board includes a sleeve portion 401 for coupling with a pin of the electrical component. Sleeve portion 401 encloses the pin in a substantially cylindrical or annular aspect. Sleeve portion 401 further couples to a barrel interconnecting two or more layers of the circuit board and conforms upon insertion within the barrel to a contour thereof to achieve the coupling of the electrical component to the circuit board.

Coupling device 400 for removably coupling an electrical component with a circuit board also includes a flange portion 402 coupled to an end 432 of sleeve portion 401. Flange portion 402 deters inserting end 432 beyond a surface of the barrel upon insertion of sleeve portion 401 therein. Upon this insertion, flange portion 402 is positioned proximate to that surface, in one embodiment abutting it.

In one embodiment, sleeve portion 401 comprises a conductive material and includes a first section 410, which has a substantially cylindrical configuration and a first end 411, for insertion into the barrel, and an opposing second end 412. An inner surface 413 of first section 410 is elastically conformable to an outer surface of a component's pin for forming an electrical and/or mechanical connection thereto.

FIGS. 4B and 4C depict other perspectives (e.g., side and top, respectively) of exemplary device 400 for removably coupling an electrical component with a circuit board, according to an embodiment of the present invention. FIGS. 4B, 4C and 4A will be discussed together for clarity and brevity. Sleeve portion 401 also includes a second section 420, which has a first end 421 and an opposing second end 422. Second section 420 is coupled at its first end 421 to the second end 412 of first section 410. Second section comprises multiple contacting elements 425 arrayed about a vertical axis 499 (FIG. 4B) of the cylindrical configuration.

Contacting elements 425 have separation from each other (e.g., where they bow out from the vertical axis 499 near the center of their lengths). Contacting elements 425 are coupled one to another by first section 410. Each of said contacting elements is, upon insertion therein, elastically conformable to an inner surface of the conductive barrel for forming an electrical and/or a mechanical connection thereto.

In the depicted embodiment, conducting elements 425 have a bowed shape, which has a convex configuration with respect to a the cylindrical aspect of coupling device 400. In another embodiment, conducting elements 425 have a bowed shape, which has a concave configuration with respect to the cylindrical aspect of coupling device 400. In the present embodiment, wherein contacting elements 425 have a convex configuration, each of the contacting elements 425 is, upon insertion therein, elastically conformable to an inner surface of the conductive barrel for forming an electrical and/or a mechanical connection thereto.

Sleeve portion 401 also includes a third section 430, which has a substantially cylindrical configuration. Third section 430 has a first end 431 and an opposing second end 432. Third section 430 is coupled at its first end 431 to the second end 422 of second section 420. Contacting elements 425 are further coupled one to another by third section 430.

An inner surface of third section 430 is elastically conformable to an outer surface of the component's pin for forming an electrical and/or mechanical connection thereto. In one embodiment, flange portion 402 is coupled to the second end 432 of third section 430 of the sleeve portion 401.

In one embodiment, device 400, including one or more of first, second and third sections 410, 420 and 430 and flange portion 402 comprise integral parts of a single material piece. In one embodiment, device 400 also includes a slot 465 along a side of the device 400 that runs substantially parallel with the longitudinal axis 499. Advantageously, slot 465 allows device 400 to elastically conform to variation in sizes corresponding to the component's pin and to the conductive barrel.

Upon insertion, the conductive barrel encloses sleeve portion 401 in a substantially cylindrical or annular aspect. In response to a force associated with the insertion, the contacting elements 425 conform to the inner surface of the conductive barrel to form an electrical and mechanical contact therewith. Advantageously however, the force required is relatively small and, upon the coupling, a dimension of the conductive barrel and the integrity of the circuit board proximate to the conductive barrel remain substantially constant, relative to before said coupling. This lack of deformity substantially reduces the possibility of damage associated with coupling components to the circuit board.

In one embodiment, upon the coupling, device 400 couples with the conductive barrel to form a gas-tight coupling therewith. In one such embodiment, flange portion 402 abuts with a surface of the conductive barrel.

It is appreciated that device 400 can be made of a number of different conductive materials, including copper and alloys thereof. In one embodiment, device 400 comprises a half-hardened beryllium-copper alloy, which has excellent thermal, material, electrical, and/or other physical properties for a variety of applications.

Exemplary Methods

Figure 5:
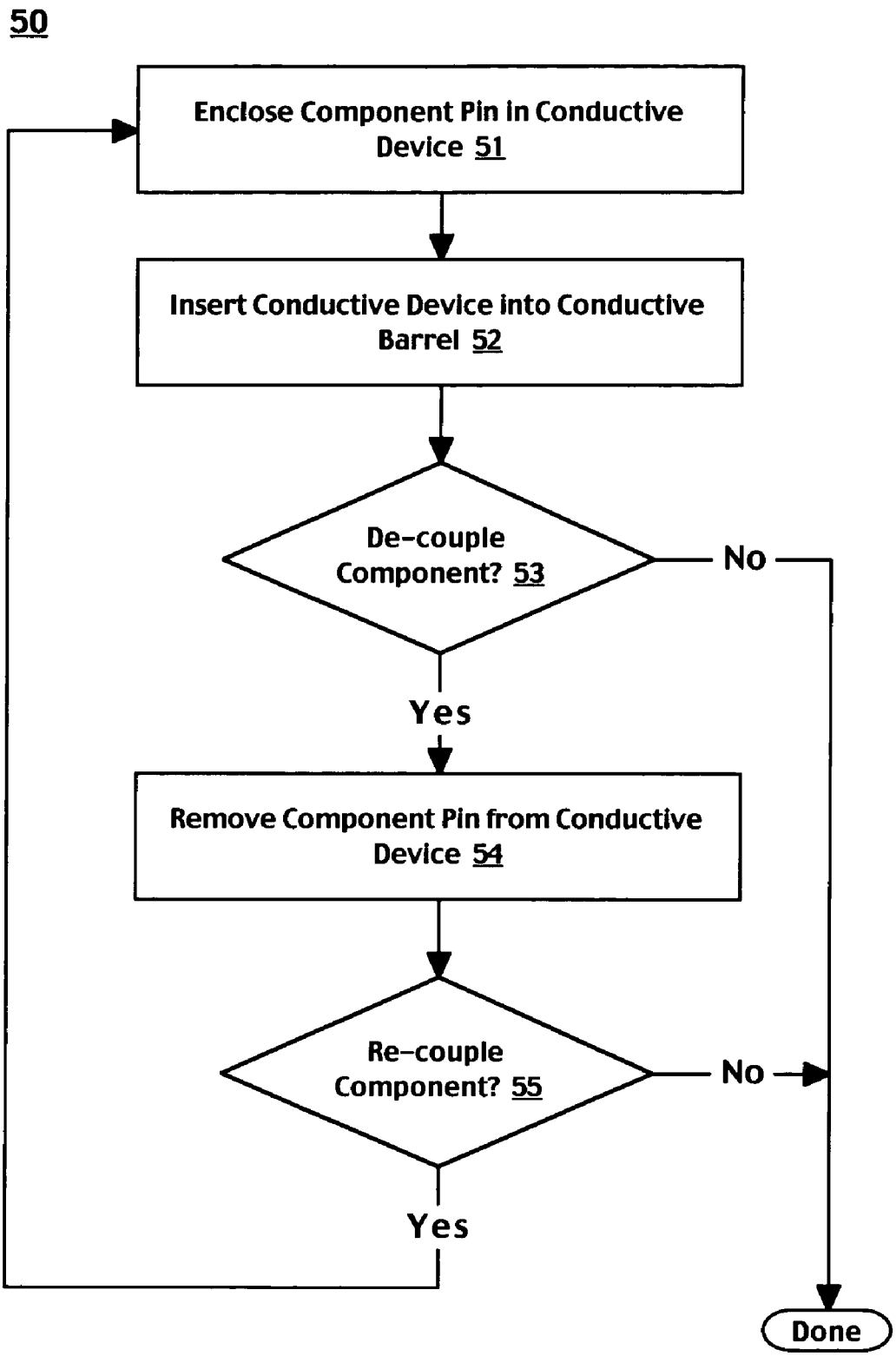
FIG. 5 is a flowchart of an exemplary process for removably coupling an electrical component with a printed circuit board, according to an embodiment of the present invention.

FIG. 5 is a flowchart of an exemplary process 50 for removably coupling an electrical component with a circuit board, according to an embodiment of the present invention. Process 50 begins with step 51, wherein a pin of the electrical component is enclosed within a conductive device. The conductive device ensconces said pin in a substantially cylindrical or annular aspect and removably connects, electrically and mechanically, thereto.

In step 52, the conductive device is inserted into a conductive barrel, which interconnects conductive elements of two or more layers of said circuit board, wherein the sleeve portion conforms upon insertion within the barrel to an inner contour thereof to achieve removable electrical and mechanical coupling of the electrical component with the circuit board.

In step 53, it is determined whether the electrical component is to be decoupled from the circuit board. If not, than process 50 can be complete. If the electrical component is to be decoupled from the circuit board, than in step 54, the pin of the electrical component is removed from the conductive device.

In step 55, it is determined whether the electrical component is to be re-coupled to the circuit board. If not, than process 50 can be complete. If the electrical component is to be re-coupled to the circuit board, than process 50 loops back and repeats steps 51, etc.

Figure 6:
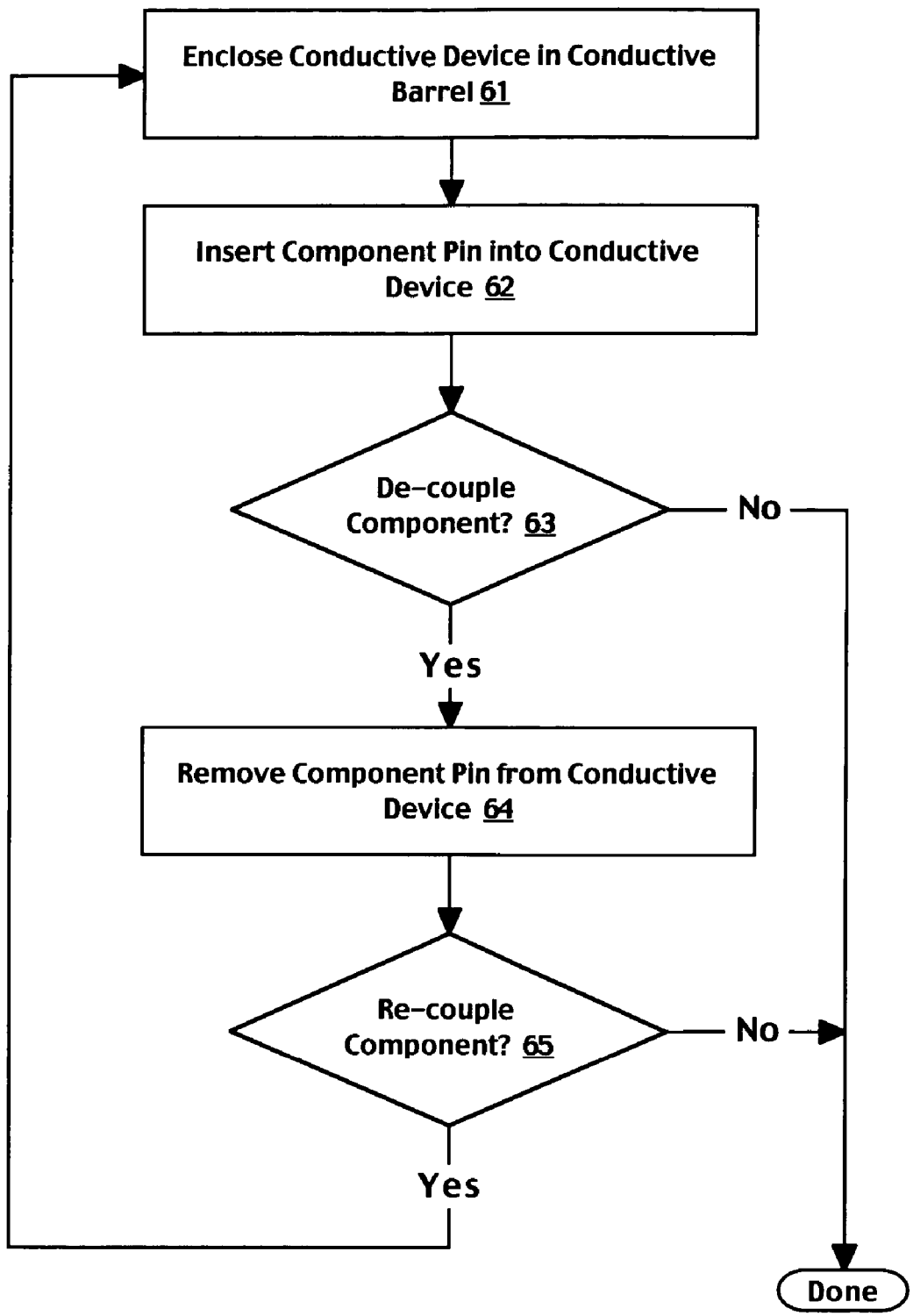
FIG. 6 is a flowchart of another exemplary process for removably coupling an electrical component with a printed circuit board, according to an embodiment of the present invention.

FIG. 6 is a flowchart of another exemplary process 60 for removably coupling an electrical component with a circuit board, according to an embodiment of the present invention. Process 60 begins with step 61, wherein a conductive device is enclosed within a conductive barrel, which interconnects conductive elements of two or more layers of the circuit board. The conductive sleeve conforms upon insertion within the conductive barrel to an inner contour thereof.

In step 62, a pin of the electrical component is inserted within the conductive device. The conductive device ensconces the pin in a substantially cylindrical or annular aspect and removably connects, electrically and mechanically, thereto to achieve removable electrical and mechanical coupling of the electrical component with said circuit board.

In step 63, it is determined whether the electrical component is to be decoupled from the circuit board. If not, than process 60 can be complete. If the electrical component is to be decoupled from the circuit board, than in step 64, the pin of the electrical component is removed from the conductive device.

In step 65, it is determined whether the electrical component is to be re-coupled to the circuit board. If not, than process 60 can be complete. If the electrical component is to be re-coupled to the circuit board, than process 60 loops back and repeats steps 62, etc.

Another Exemplary Coupling Device Configuration

Figure 7A:
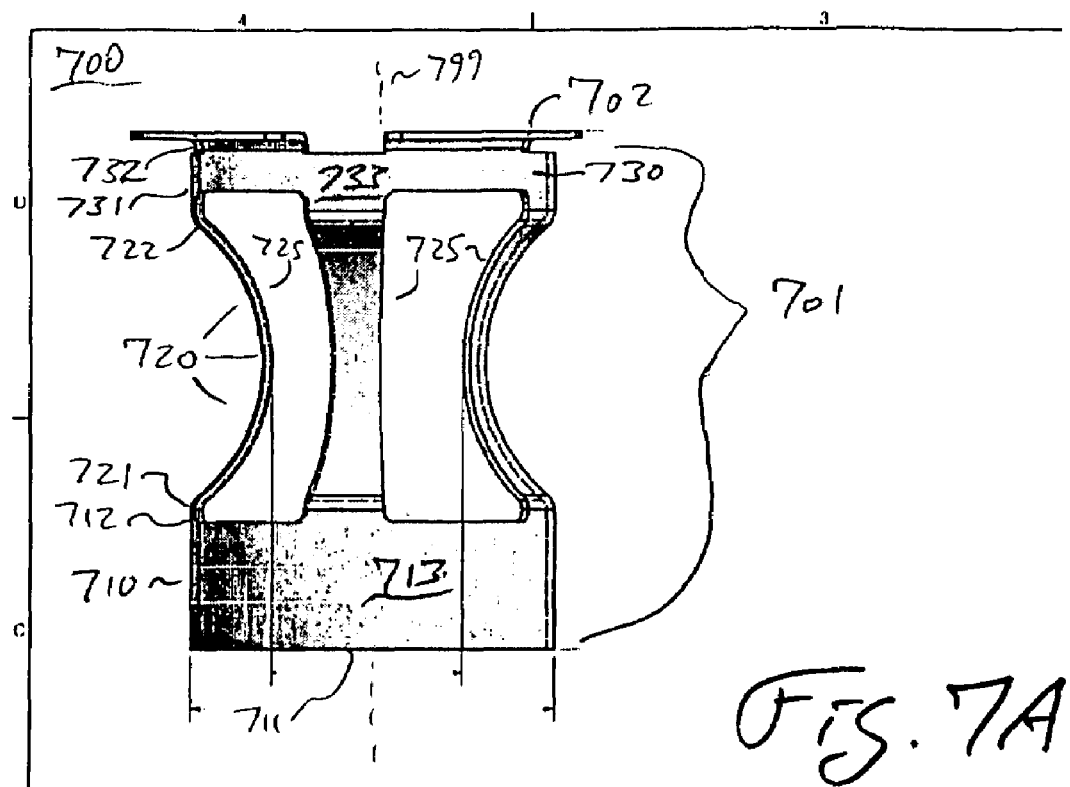
FIGS. 7A-7B depict another exemplary device for removably coupling an electrical component with a circuit from several perspectives, according to an embodiment of the present invention.
Figure 7B:
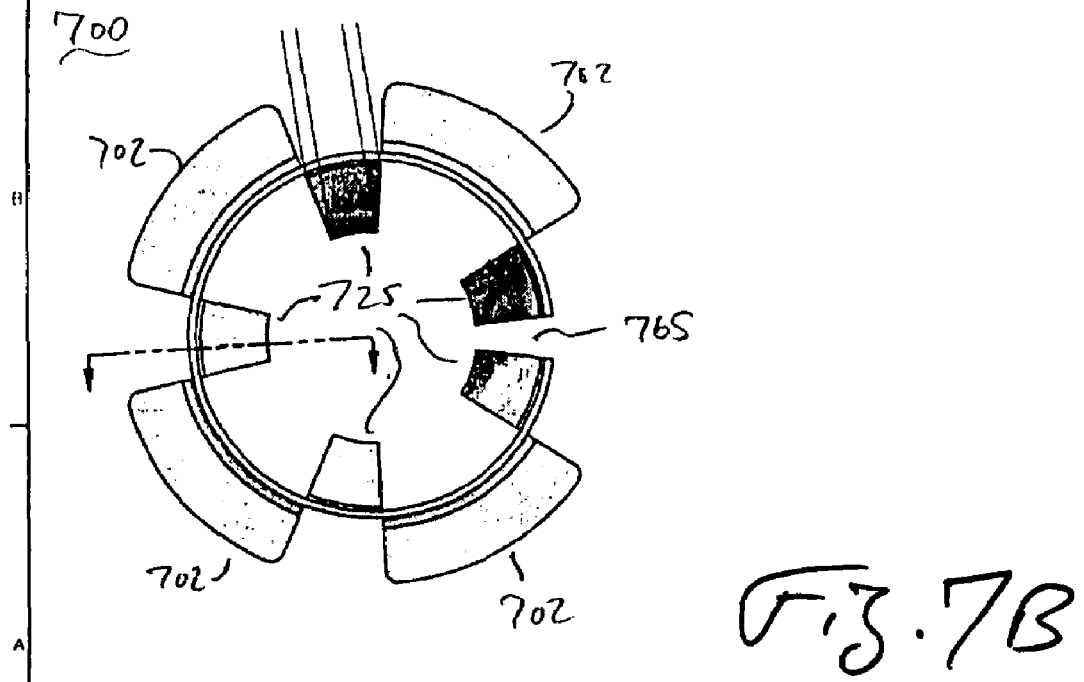

FIGS. 7A and 7B depict another exemplary device 700 for removably coupling an electrical component with a circuit from several perspectives, according to an embodiment of the present invention. Coupling device 700 comprises one implementation of a compliant coupling sleeve device, such as sleeve device 301 (FIG. 3A, 3B).

Coupling device 700 for removably coupling an electrical component with a circuit board includes a sleeve portion 701. Sleeve portion 701 encloses the pin in a substantially cylindrical or annular aspect. Sleeve portion 701 further couples to a barrel interconnecting two or more layers of the circuit board and conforms upon insertion within the barrel to a contour thereof to achieve the coupling of the electrical component to the circuit board.

Coupling device 700 for removably coupling an electrical component with a circuit board also includes a flange portion 702 coupled to an end 732 of sleeve portion 701. Flange portion 702 deters inserting end 732 beyond a surface of the barrel upon insertion of sleeve portion 701 therein. Upon this insertion, flange portion 702 is positioned proximate to that surface, in one embodiment abutting it.

In one embodiment, sleeve portion 701 comprises a conductive material and includes a first section 710, which has a substantially cylindrical configuration and a first end 711, for insertion into the barrel, and an opposing second end 712. An outer surface 713 of first section 710 is elastically conformable to an inner surface of the conductive barrel for forming an electrical and/or mechanical connection thereto.

FIG. 7B depicts another (e.g., top) perspective of exemplary device 700 for removably coupling an electrical component with a circuit board, according to an embodiment of the present invention. FIGS. 7B and 7A will be discussed together for clarity and brevity. Sleeve portion 701 also includes a second section 720, which has a first end 721 and an opposing second end 722. Second section 720 is coupled at its first end 721 to the second end 712 of first section 410. Second section comprises multiple contacting elements 725 arrayed about a vertical axis 799 (FIG. 7A) of the cylindrical configuration.

Contacting elements 725 have separation from each other (e.g., where they bow in towards the vertical axis 799 near the center of their lengths). Contacting elements 725 are coupled one to another by first section 710. Each of said contacting elements 725 is, upon insertion therein, elastically conformable to an outer surface of the pin of an electrical component for forming an electrical and/or a mechanical connection thereto.

In the depicted embodiment, conducting elements 725 have a bowed shape, which has a concave configuration, each of said contacting elements is, upon insertion thereof, elastically conformable to an outer surface of the pin. Sleeve portion 701 also includes a third section 730, which has a substantially cylindrical configuration. Third section 730 has a first end 731 and an opposing second end 732. Third section 430 is coupled at its first end 731 to the second end 722 of second section 720.

Contacting elements 425 are further coupled one to another by third section 730. An outer surface 733 of third section 430 is elastically conformable to an inner surface of the conductive barrel for forming an electrical and/or mechanical connection thereto. In one embodiment, flange portion 402 is coupled to the second end 732 of third section 430 of the sleeve portion 401. One or more of outer surfaces 713 and 733, of first section 710 and third section 730, respectively, is elastically conformable to an inner surface of the barrel for forming an electrical and/or mechanical connection thereto.

In one embodiment, device 700, including one or more of first, second and third sections 710, 720 and 730 and flange portion 702 comprise integral parts of a single material piece. In one embodiment, device 700 also includes a slot 765 along a side of the device 700 that runs substantially parallel with the longitudinal axis 799. Advantageously, slot 465 helps allow device 700 to elastically conform to variation in sizes corresponding to the component's pin and to the conductive barrel.

Upon insertion, the conductive barrel encloses sleeve portion 701 in a substantially cylindrical or annular aspect. In response to a force associated with the insertion, the contacting elements 725 conform to the outer surface of the component pin to form an electrical and mechanical contact therewith. Advantageously however, the force required is relatively small and, upon the coupling, a dimension of the conductive barrel and the integrity of the circuit board proximate to the conductive barrel remain substantially constant, relative to before said coupling. This lack of deformity substantially reduces the possibility of damage associated with coupling components to the circuit board.

In one embodiment, upon the coupling, device 700 couples with the conductive barrel to form a gas-tight coupling therewith. In one such embodiment, flange portion 702 abuts with a surface of the conductive barrel.

It is appreciated that device 700 can be made of a number of different conductive materials, including copper and alloys thereof. In one embodiment, device 400 comprises a half-hardened beryllium-copper alloy, which has excellent thermal, material, electrical, and/or other physical properties for a variety of applications.

A device, apparatus and printed circuit board assembly for removably coupling an electrical component with a printed circuit board is thus described. While the present invention has been described in particular exemplary embodiments, it should be appreciated that the present invention should not be construed as limited by such embodiments, but rather construed according to the following claims and their equivalents.

What is claimed is:

1. A device comprising:
   a sleeve to couple with a pin of an electrical component, wherein the sleeve substantially encloses said pin, wherein the sleeve further removably couples to a barrel interconnecting two or more layers of a printed circuit board, and the sleeve, when removably coupled to the barrel, conforms to an inner surface of the barrel to couple the electrical component to the printed circuit board; and a flange coupled to the sleeve to deter the sleeve from removably coupling to the barrel beyond an outer surface of the barrel, where the flange is positioned proximate to the outer surface of the barrel after the sleeve is removably coupled to the barrel.

2. The device as recited in claim 1 wherein, upon said coupling, said device couples with said barrel to form a gas-tight coupling therewith and wherein said flange portion abuts with said surface.

3. The device as recited in claim 1 wherein, upon said coupling, a dimension of said barrel and the integrity of said printed circuit board proximate to said barrel remain substantially constant, relative to before said coupling.

4. The device as recited in claim 3 wherein said removably coupling is repeatable.

5. A device for removably coupling an electrical component with a printed circuit board, comprising:

a sleeve portion for coupling with a pin of said electrical component wherein said sleeve portion encloses said pin in a substantially cylindrical aspect, wherein said sleeve portion further couples to a barrel interconnecting two or more layers of said circuit board, and wherein said sleeve portion conforms upon insertion within said barrel to a contour thereof to achieve said coupling of said electrical component to said printed circuit board;

a flange portion coupled to an end of said sleeve portion, for deterring inserting said end beyond a surface of said barrel upon insertion of said sleeve portion therein wherein, upon said insertion, said flange portion is positioned proximate to said surface;

wherein said sleeve portion comprises a conductive material, said sleeve portion further comprising:

a first section having a substantially cylindrical configuration having opposing first and second ends, said first end for insertion into said barrel;

a second section having opposing first and second ends and coupled at its first end to said second end of said first section, said second section comprising a plurality of contacting elements arrayed about a longitudinal axis of said cylindrical configuration with separation from each other, and wherein said contacting elements are coupled one to another by said first section; and a third section having a substantially cylindrical configuration having opposing first and second ends, said third section coupled at said first end to said second end of said second section wherein said contacting elements are further coupled one to another by said third section.

6. The device as recited in claim 5 wherein each of said conducting elements has a bowed shape, said bowed shape comprising a convex configuration or a concave configuration with respect to a said cylindrical aspect wherein:

in said convex configuration, each of said contacting elements is, upon insertion therein, elastically conformable to an inner surface of said barrel for forming one or more of an electrical and a mechanical connection thereto and wherein an inner surface of one or more of said first section and said third section is elastically conformable to an outer surface of said pin for forming one or more of an electrical and a mechanical connection thereto; and in said concave configuration, each of said contacting elements is, upon insertion thereof, elastically conformable to an outer surface of said pin and wherein an inside surface of one or more of said first section and said third section is elastically conformable to an inner surface of said barrel for forming one or more of an electrical and a mechanical connection thereto.

7. The device as recited in claim 5 wherein said flange portion is coupled to said second end of said third section of said sleeve portion.

8. The device as recited in claim 5 wherein one or more of said first section, said second section said third section, and said flange portion comprise integral parts of a single material piece.

9. The device as recited in claim 5 further comprising a slot disposed within a side thereof, said slot disposed to run substantially parallel with said longitudinal axis, wherein said slot helps allow said device to elastically conform to variation in sizes corresponding to one or more of said pin and said barrel.

10. The device as recited in claim 5 wherein said conductive material comprises a half-hardened beryllium-copper alloy.

11. An apparatus comprising:

a conductive barrel for electrically intercoupling two or more of a plurality of layers of a printed circuit board; and a conductive device for electrically and mechanically coupling a pin of an electrical component with the conductive barrel, wherein said conductive device comprises:

a sleeve to couple with a pin of the electrical component, wherein the sleeve substantially encloses said pin wherein the sleeve further removably couples to a barrel interconnecting two or more layers of a printed circuit board, and the sleeve, when removably coupled to the barrel, conforms to an inner surface of the barrel to couple the electrical component to the printed circuit board; and a flange coupled to the sleeve to deter the sleeve from removably coupling to the barrel beyond an outer surface of the barrel, where the flange is positioned proximate to the outer surface of the barrel after the sleeve is removably coupled to the barrel.

12. The apparatus as recited in claim 11 wherein, upon said coupling, said device couples with said barrel to form a gas-tight coupling therewith and wherein said flange portion abuts with said surface.

13. The apparatus as recited in claim 11 wherein, upon said coupling, a dimension of said barrel and the integrity of said printed circuit board proximate to said barrel remain substantially constant, relative to before said coupling.

14. The apparatus as recited in claim 13 wherein said removably coupling is repeatable.

15. An apparatus for removably coupling an electrical component with a printed circuit board, comprising:

a conductive barrel for electrically intercoupling two or more of a plurality of layers comprising said printed circuit board;

a conductive device for electrically and mechanically coupling a pin of said electrical component with said conductive barrel, wherein said conductive device comprises a sleeve portion for coupling with a pin of said electrical component wherein said sleeve portion encloses said pin in a substantially cylindrical aspect, wherein said sleeve portion further couples to a barrel interconnecting two or more layers of said circuit board, and wherein said sleeve portion conforms upon insertion within said barrel to a contour thereof to achieve said coupling of said electrical component to said printed circuit board; and a flange portion coupled to an end of said sleeve portion, for deterring inserting said end beyond a surface of said barrel upon insertion of said sleeve portion therein wherein, upon said insertion, said flange portion is positioned proximate to said surface;

wherein said sleeve portion comprises a conductive material, said sleeve portion further comprising a first section having a substantially cylindrical configuration having opposing first and second ends, said first end for insertion into said barrel;

a second section having opposing first and second ends and coupled at its first end to said second end of said first section, said second section comprising a plurality of contacting elements arrayed about a longitudinal axis of said cylindrical configuration with separation from each other, and wherein said contacting elements are coupled one to another by said first section; and a third section having a substantially cylindrical configuration having opposing first and second ends, said third section coupled at said first end to said second end of said second section wherein said contacting elements are further coupled one to another by said third section.

16. The apparatus as recited in claim 15 wherein each of said conducting elements has a bowed shape, said bowed shape comprising a convex configuration or a concave configuration with respect to a said cylindrical aspect wherein:

in said convex configuration, each of said contacting elements is, upon insertion therein, elastically conformable to an inner surface of said barrel for forming one or more of an electrical and a mechanical connection thereto and wherein an inner surface of one or more of said first section and said third section is elastically conformable to an outer surface of said pin for forming one or more of an electrical and a mechanical connection thereto; and in said concave configuration, each of said contacting elements is, upon insertion thereof, elastically conformable to an outer surface of said pin and wherein an inside surface of one or more of said first section and said third section is elastically conformable to an inner surface of said barrel for forming one or more of an electrical and a mechanical connection thereto.

17. The apparatus as recited in claim 15 wherein said flange portion of said device is coupled to said second end of said third section of said sleeve portion of said device.

18. The apparatus as recited in claim 15 wherein said device comprises a single conductive material piece.

19. The apparatus as recited in claim 15 wherein said device further comprises a slot disposed within a side thereof, said slot disposed to run substantially parallel with said longitudinal axis, wherein said slot helps allow said device to elastically conform to variation in sizes corresponding to one or more of said pin and said barrel.

20. The apparatus as recited in claim 15 wherein said conductive material comprises a half-hardened beryllium-copper alloy.

21. A circuit board assembly comprising:

a printed circuit board for removably coupling with an electrical component, said printed circuit board comprising a plurality of layers, wherein more than one of said layers is perforated by a hole wherein more than one layer of said plurality comprises a conductive element and wherein said hole exposes said conductive elements on an inner surface thereof;

a conductive barrel positioned within said hole for electrically intercoupling said conductive elements; and a conductive device removably coupled with said conductive barrel for electrically and mechanically coupling a pin of said electrical component with said conductive barrel wherein said conductive device comprises:

a sleeve to couple with a pin of the electrical component, wherein the sleeve substantially encloses said pin, wherein the sleeve further removably couples to a barrel interconnecting two or more layers of a printed circuit board, and the sleeve, when removably coupled to the barrel, conforms to an inner surface of the barrel to couple the electrical component to the printed circuit board; and a flange coupled to the sleeve to deter the sleeve from removably coupling to the barrel beyond an outer surface of the barrel, where the flange is positioned proximate to the outer surface of the barrel after the sleeve is removably coupled to the barrel.

22. The circuit board assembly as recited in claim 21 wherein said device couples with said barrel to form a gas-tight coupling therewith and wherein said flange portion abuts with said surface.

23. The device as recited in claim 21 wherein, upon said coupling, a dimension of said barrel and the integrity of said printed circuit board proximate to said barrel remain substantially constant, relative to before said coupling.

24. The device as recited in claim 23 wherein said removably coupling is repeatable.

25. The circuit board assembly as recited in claim 21 said electrical component comprises one or more of a power brick and an electronic element.

26. A circuit board assembly comprising:

a printed circuit board for removably coupling with an electrical component, said printed circuit board comprising a plurality of layers, wherein more than one of said layers is perforated by a hole wherein more than one layer of said plurality comprises a conductive element and wherein said hole exposes said conductive elements on an inner surface thereof;

a conductive barrel positioned within said hole for electrically intercoupling said conductive elements; and a conductive device removably coupled with said conductive barrel for electrically and mechanically coupling a pin of said electrical component with said conductive barrel wherein said conductive device comprises:

a sleeve portion for coupling with a pin of said electrical component wherein said sleeve portion encloses said pin in a substantially cylindrical aspect, wherein said sleeve portion further couples to a barrel interconnecting two or more layers of said circuit board, and wherein said sleeve portion conforms upon insertion within said barrel to a contour thereof to achieve said coupling of said electrical component to said printed circuit board;

a flange portion coupled to an end of said sleeve portion, for deterring inserting said end beyond a surface of said barrel upon insertion of said sleeve portion therein wherein, upon said insertion, said flange portion is positioned proximate to said surface;

wherein said sleeve portion of said device comprises a conductive material, said sleeve portion further comprising a first section having a substantially cylindrical configuration having opposing first and second ends, said first end for insertion into said barrel;

a second section having opposing first and second ends and coupled at its first end to said second end of said first section, said second section comprising a plurality of contacting elements arrayed about a longitudinal axis of said cylindrical configuration with separation from each other, and wherein said contacting elements are coupled one to another by said first section; and a third section having a substantially cylindrical configuration having opposing first and second ends, said third section coupled at said first end to said second end of said second section wherein said contacting elements are further coupled one to another by said third section.

27. The circuit board assembly as recited in claim 26 wherein each of said conducting elements of said device has a bowed shape, said bowed shape comprising a convex configuration or a concave configuration with respect to a said cylindrical aspect wherein:

in said convex configuration, each of said contacting elements is, upon insertion therein, elastically conformable to an inner surface of said barrel for forming one or more of an electrical and a mechanical connection thereto and wherein an inner surface of one or more of said first section and said third section is elastically conformable to an outer surface of said pin for forming one or more of an electrical and a mechanical connection thereto; and in said concave configuration, each of said contacting elements is, upon insertion thereof, elastically conformable to an outer surface of said pin and wherein an inside surface of one or more of said first section and said third section is elastically conformable to an inner surface of said barrel for forming one or more of an electrical and a mechanical connection thereto.

28. The circuit board assembly as recited in claim 26 wherein said flange portion of said device is coupled to said second end of said third section of said sleeve portion of said device.

29. The circuit board assembly as recited in claim 26 wherein said device further comprises a slot disposed within a side thereof, said slot disposed to run substantially parallel with said longitudinal axis, wherein said slot helps allow said device to elastically conform to variation in sizes corresponding to one or more of said pin and said barrel.

30. A system comprising:

means for electrically intercoupling two or more of a plurality of layers of a printed circuit board; and means for electrically and mechanically coupling a pin of an electrical component with said electrical intercoupling means, wherein said means for electrically and mechanically comprise:

means for securely and removably enclosing the pin;

means for conforming to an inner contour of the means for electrical intercoupling and for removably binding thereto wherein the means for conforming and the means for binding achieve the coupling of the electrical component to the printed circuit board; and means for deterring inserting the pin beyond a plane proximate to a surface of the printed circuit board.

\* \* \* \* \*

UNITED STATES PATENT AND TRADEMARK OFFICE
CERTIFICATE OF CORRECTION

PATENT NO.        : 7,277,297 B2                                    Page 1 of 1
APPLICATION NO. : 11/066877
DATED             : October 2, 2007
INVENTOR(S)       : Mudasir Ahmad It is certified that error appears in the above-identified patent and that said Letters Patent is hereby corrected as shown below:

On the Title page, Item (73), please delete "Inc" and insert -- Inc. --.

At column 12, line 12, please delete "section said" and insert -- section, said --.

At column 12, line 34, please delete "wherein" and insert -- , wherein --.

Signed and Sealed this

Twenty-second Day of December, 2009

David J. Kappos
*Director of the United States Patent and Trademark Office*